United States Patent
Sakai et al.

(10) Patent No.: US 8,450,030 B2
(45) Date of Patent: May 28, 2013

(54) THIN FILM EVALUATION METHOD, MASK BLANK, AND TRANSFER MASK

(75) Inventors: Kazuya Sakai, Tokyo (JP); Masaru Tanabe, Tokyo (JP)

(73) Assignee: Hoya Corporation, Tokyo (JP)

( * ) Notice: Subject to any disclaimer, the term of this patent is extended or adjusted under 35 U.S.C. 154(b) by 148 days.

(21) Appl. No.: 13/109,655

(22) Filed: May 17, 2011

(65) Prior Publication Data
US 2011/0287347 A1 Nov. 24, 2011

(30) Foreign Application Priority Data
May 19, 2010 (JP) ................................. 2010-115833

(51) Int. Cl.
*G03F 1/00* (2006.01)
*G06K 9/00* (2006.01)

(52) U.S. Cl.
USPC .................. 430/5; 430/30; 430/945; 382/144

(58) Field of Classification Search
USPC ................................ 430/5, 30, 945; 382/144
See application file for complete search history.

(56) References Cited

FOREIGN PATENT DOCUMENTS
JP 2002-156742 A 5/2002
JP 2002-258455 A 9/2002

*Primary Examiner* — Christopher Young
(74) *Attorney, Agent, or Firm* — Sughrue Mion, PLLC

(57) ABSTRACT

Provided is a thin film evaluation method for a transfer mask which is adapted to be applied with ArF excimer laser exposure light and comprises a thin film formed with a pattern on a transparent substrate. The method includes intermittently irradiating pulsed laser light onto the thin film to thereby evaluate the irradiation durability of the thin film.

10 Claims, 4 Drawing Sheets

THIN FILM EVALUATION METHOD, MASK BLANK, AND TRANSFER MASK This application is based upon and claims the benefit of priority from Japanese patent application No. 2010-115833, filed on May 19, 2010, the disclosure of which is incorporated herein in its entirety by reference.

TECHNICAL FIELD

This invention relates to a method of evaluating the irradiation durability of a thin film and to a mask blank and a transfer mask. In particular, this invention relates to a method of evaluating the irradiation durability of a thin film of a transfer mask adapted to be used in an exposure apparatus using exposure light having a short wavelength of 200 nm or less and further relates to a mask blank for such a transfer mask and to such a transfer mask.

BACKGROUND ART

Generally, fine pattern formation is carried out by photolithography in the manufacture of a semiconductor device. A number of substrates called transfer masks are normally used for such fine pattern formation. The transfer mask comprises generally a transparent glass substrate having thereon a fine pattern made of a metal thin film or the like. The photolithography is used also in the manufacture of the transfer mask.

In the manufacture of a transfer mask by photolithography, use is made of a mask blank having a thin film (e.g. a thin film made of a material containing a transition metal) for forming a transfer pattern (mask pattern) on a transparent substrate such as a glass substrate. The manufacture of the transfer mask using the mask blank comprises an exposure process of writing a required pattern on a resist film formed on the mask blank, a developing process of developing the resist film to form a resist pattern in accordance with the written pattern, an etching process of etching the thin film along the resist pattern, and a process of stripping and removing the remaining resist pattern. In the developing process, a developer is supplied after writing the required pattern on the resist film formed on the mask blank to dissolve a portion of the resist film soluble in the developer, thereby forming the resist pattern. In the etching process, using the resist pattern as a mask, an exposed portion of the thin film, where the resist pattern is not formed, is dissolved by dry etching or wet etching, thereby forming a required mask pattern on the transparent substrate. In this manner, the transfer mask is produced.

For miniaturization of a pattern of a semiconductor device, it is necessary to shorten the wavelength of exposure light for use in photolithography in addition to miniaturization of the mask pattern of the transfer mask. In recent years, the wavelength of exposure light for use in the manufacture of a semiconductor device has been shortened from KrF excimer laser light (wavelength: 248 nm) to ArF excimer laser light (wavelength: 193 nm).

As a type of transfer mask, a halftone phase shift mask is known apart from a conventional binary mask having a light-shielding film pattern made of a chromium-based material on a transparent substrate. This halftone phase shift mask is configured to have a phase shift film in the form of a light-semitransmissive film on a transparent substrate. This phase shift film in the form of the light-semitransmissive film is adapted to transmit light having an intensity that does not substantially contribute to exposure (e.g. 1% to 20% at an exposure wavelength) and to provide a predetermined phase difference. The halftone phase shift mask has phase shift portions formed by patterning the phase shift film and light-transmissive portions formed with no phase shift film and adapted to transmit light having an intensity that substantially contributes to exposure. The phase shift film is formed so that the phase of the light transmitted through the phase shift portions is substantially inverted with respect to that of the light transmitted through the light-transmissive portions. As a consequence, the lights having passed near the boundaries between the phase shift portions and the light-transmissive portions and bent into the others' regions due to diffraction cancel each other out. This makes the light intensity at the boundaries approximately zero to thereby improve the contrast, i.e. the resolution, at the boundaries. As a material of the phase shift film, a molybdenum silicide compound, which is a material containing molybdenum and silicon, is widely used.

Further, there is a special type of light-semitransmissive film which is mainly used as a thin film for forming a pattern of an enhancer mask. Light-semitransmissive portions formed by this light-semitransmissive film transmit exposure light at a predetermined transmittance, but different from the halftone phase shift film, the phase of the exposure light transmitted through the light-semitransmissive portions becomes approximately the same as the phase of the exposure light transmitted through light-transmissive portions. Also as a material of this light-semitransmissive film, a molybdenum silicide compound, which is a material containing molybdenum and silicon, is widely used.

Further, in recent years, there has also appeared a binary mask using, as a light-shielding film, a molybdenum silicide compound which is a material containing molybdenum and silicon.

SUMMARY OF THE INVENTION

Following the reduction in exposure light wavelength in recent years, however, mask degradation due to the repeated use of a transfer mask has become notable. Particularly in the case of a phase shift mask, a phenomenon occurs in which the transmittance and the phase difference change and further the line width changes (increases) due to the irradiation of ArF excimer laser light (wavelength: 193 nm) as exposure light. In the case of the phase shift mask, such changes in the transmittance and phase difference are serious problems that affect the mask performance. If the change in the transmittance becomes large, the transfer accuracy is degraded. Along with this, if the change in the phase difference becomes large, the phase shift effect at the pattern boundaries is difficult to obtain so that the contrast at the pattern boundaries is lowered and thus the resolution is significantly reduced. Further, the change in the line width degrades the CD (Critical Dimension) accuracy of the phase shift mask and finally degrades the CD accuracy of a pattern-transferred wafer.

The problem of the mask degradation due to the repeated use of the transfer mask is significant particularly in the case of a phase shift mask in which a transition metal silicide compound, a material containing a transition metal and silicon, is used as a material of a phase shift film. But, also in the case of an enhancer mask in which a transition metal silicide compound, a material containing a transition metal and silicon, is used as a material of a light-semitransmissive film, there have arisen problems of a change in the transmittance of the light-semitransmissive film, a change in the phase difference, and a degradation in the CD accuracy due to a change (increase) in the line width of the pattern.

Also in the case of a binary mask in which a material containing a transition metal is used as a material of a light-shielding film, the degradation in the CD accuracy due to a change (increase) in the line width of a light-shielding film pattern arises as a problem in the same way.

According to the study of the present inventor, the background of the problem of the mask degradation due to the repeated use of the transfer mask is assumed as follows. Conventionally, for example, when haze (e.g. foreign matter composed mainly of ammonium sulfide and generated on the mask) is generated, cleaning is carried out for removing the haze. This cleaning entails an unavoidable film loss (dissolution) of a light-shielding film or a light-semitransmissive film and thus, roughly, the number of times of cleaning determines the mask lifetime. However, since the number of times of cleaning is reduced due to an improvement to haze in recent years, the period of time of the repeated use of a mask is prolonged and thus the time of exposure to exposure light is prolonged correspondingly. As a consequence, the problem of the mask degradation has been actualized and, particularly, a problem of irradiation durability against short-wavelength light such as ArF excimer laser light has been newly actualized. Nevertheless, since the transfer mask manufacturing cost has been increasing following the pattern miniaturization, there is an increasing need for a longer lifetime of a transfer mask.

Also conventionally, a measure has been taken to suppress the change in the transmittance of the phase shift film and the change in the phase difference due to the irradiation of exposure light. For example, a phase shift film composed mainly of a metal and silicon is heat-treated in the atmosphere or an oxygen atmosphere at 250 to 350° C. for 90 to 150 minutes (see, e.g. JP-A-2002-156742 (Patent Document 1)) or a cap layer composed mainly of a metal and silicon is formed on a phase shift film composed mainly of a metal and silicon (see, e.g. JP-A-2002-258455 (Patent Document 2)). However, a further improvement in irradiation durability of a film to exposure light is required in the course of the reduction in wavelength of exposure light in recent years.

This invention has been made under these circumstances and has an object to provide a transfer mask in which the irradiation durability of a thin film made of a material containing a transition metal against exposure light having a wavelength of 200 nm or less is evaluated and guaranteed, and further to provide a mask blank for such a transfer mask and a method of evaluating the irradiation durability of such a thin film.

The present inventors have assumed a cause of the degradation of the transfer mask due to its repeated use becoming notable following the reduction in exposure light wavelength, as follows.

The present inventors have examined a pattern of a phase shift film made of a MoSi-based material and subjected to changes in the transmittance and phase difference and a change (increase) in the line width due to the repeated use. As a result, the present inventor has found that a modified layer containing Si, O, and a little Mo is formed on the surface layer side of the MoSi-based film and that this is one of main causes of the changes in the transmittance, the phase difference, and the line width. The reason (mechanism) for the formation of such a modified layer is considered as follows. That is, the conventional sputtered MoSi-based film (phase shift film) has structural gaps and, even if annealing is carried out after the film formation, the change in the structure of the MoSi-based film is small and thus these gaps can hardly be removed. On the other hand, for example, oxygen ($O_2$) and water ($H_2O$) are present in the atmosphere and ozone ($O_3$) is produced by reaction of oxygen ($O_2$) with ArF excimer laser light in the course of using a phase shift mask. The oxygen and the produced ozone enter the gaps of the MoSi-based film and react with Si and Mo forming the phase shift film. That is, when Si and Mo forming the phase shift film are subjected to irradiation of exposure light (particularly short-wavelength light such as ArF excimer laser light), they are excited into a transition state. In this event, if the ozone or the like is present around them, Si is oxidized and expanded (because $SiO_2$ is larger in volume than Si) and Mo is also oxidized. In this manner, the modified layer is formed on the surface layer side of the phase shift film. Then, while being accumulatively subjected to the irradiation of the exposure light due to the repeated use of the phase shift mask, the oxidation and expansion of Si further proceed and the oxidized Mo diffuses in the modified layer to be deposited on a surface thereof and sublimated as, for example, $MoO_3$, and as a result, the thickness of the modified layer gradually increases (the occupation ratio of the modified layer in the MoSi-based film gradually increases). This phenomenon of the formation and enlargement of the modified layer is significantly observed in the case of short-wavelength (200 nm or less) exposure light such as ArF excimer laser light having energy necessary for exciting Si and Mo of the phase shift film into the transition state. Such a phenomenon is not limited to the MoSi-based material, but also occurs in the case of a phase shift film made of a material containing another transition metal and silicon. Further, this also applies to an enhancer mask having a light-semitransmissive film made of a material containing a transition metal and silicon and to a binary mask having a light-shielding film made of a material containing a transition metal.

Based on the elucidated fact and consideration described above, the present inventor has further continued intensive studies.

In the meantime, in a semiconductor exposure apparatus, particularly, in an exposure apparatus called a scanner, a wafer stage with a semiconductor wafer placed thereon and a reticle scanning stage with a reticle, serving as a master of a circuit pattern, placed thereon are synchronously scanned in mutually opposite directions at a predetermined speed ratio so that exposure of the semiconductor wafer is carried out during the scanning.

The irradiation durability is evaluated by a simple evaluation using an acceleration test in which continuous laser light having an energy density higher than that which is used in the above-mentioned scanner exposure is irradiated.

The present inventor has advanced the research and development of a simple evaluation of the irradiation durability using an acceleration test. As a result, although it is generally considered that a severe condition such as, for example, a high energy condition is suitable as a condition of an acceleration test, the present inventor has found that there are conditions of an acceleration test that can relatively improve the correlation with the result of an irradiation durability evaluation of a mask (result of mask lifetime) when semiconductor devices are actually manufactured by scanner exposure. The present inventor has found that, in a simple evaluation of the irradiation durability using an acceleration test, the change amount (increase amount) of the line width changes depending on an irradiation method and an irradiation condition. Specifically, the present inventor has found that, by replacing, in an acceleration test, an irradiation method of continuously irradiating laser light onto a fixed portion with an irradiation method of intermittently irradiating pulsed laser light, it is possible to carry out an evaluation having a higher correlation with the result of an irradiation durability evaluation by actual scanner exposure. The reason for this is considered to be that it is possible to reproduce an irradiation state (action) which is similar to an actual scanner exposure irradiation state in which exposure light is not continuously irradiated onto a fixed portion.

According to this invention, it is possible to carry out a high-accuracy irradiation durability evaluation with only a small difference from the result of an irradiation durability evaluation by actual scanner exposure. According to this invention, as compared with the case where an irradiation durability evaluation is carried out using a scanner exposure apparatus or an equivalent apparatus, the evaluation is costless and is efficient because it is an acceleration test.

This invention has the following structures.

(Structure 1)

A thin film evaluation method for a transfer mask adapted to be applied with ArF excimer laser exposure light and comprising a thin film formed with a pattern on a transparent substrate, the method comprising:

intermittently irradiating pulsed laser light onto the thin film to thereby evaluate irradiation durability of the thin film.

(Structure 2)

The thin film evaluation method according to Structure 1, wherein the thin film is made of a material containing a transition metal and silicon.

(Structure 3)

The thin film evaluation method according to Structure 1 or 2, wherein the pulsed laser light is intermittently irradiated to a degree that does not cause heating of the thin film.

(Structure 4)

The thin film evaluation method according to any one of Structures 1 to 3, wherein the pulsed laser light is emitted by intermittent oscillation and is irradiated onto the thin film at its fixed position.

(Structure 5)

The thin film evaluation method according to Structure 4, wherein a cessation period of the intermittent oscillation is 100 msec to 3000 msec.

(Structure 6)

The thin film evaluation method according to any one of Structures 1 to 3, wherein the pulsed laser light is emitted by continuous oscillation and is intermittently irradiated onto the thin film by relatively moving the thin film with respect to the pulsed laser light.

(Structure 7)

The thin film evaluation method according to any one of Structures 1 to 6, wherein the pulsed laser light is irradiated onto the thin film in a humidity-controlled atmosphere.

(Structure 8)

The thin film evaluation method according to any one of Structures 1 to 7, wherein the pulsed laser light is irradiated onto the thin film in an environment where an amount of a chemical contaminant in an atmosphere is controlled.

(Structure 9)

The thin film evaluation method according to any one of Structures 1 to 8, wherein the thin film is a light-semitransmissive film made of a material composed mainly of a compound containing a transition metal, silicon, and one or more elements selected from oxygen and nitrogen.

(Structure 10)

The thin film evaluation method according to any one of Structures 1 to 8, wherein the thin film is a light-shielding film.

(Structure 11)

A mask blank comprising a thin film whose irradiation durability is evaluated and guaranteed by the thin film evaluation method according to any one of Structures 1 to 10.

(Structure 12)

A transfer mask manufactured by using the mask blank according to Structure 11 and patterning the thin film.

(Structure 13)

A method of manufacturing a semiconductor device, comprising forming a circuit pattern on a semiconductor wafer using the transfer mask according to Structure 12.

(Structure 14)

A method of manufacturing a transfer mask adapted to be applied with ArF excimer laser exposure light and comprising a thin film formed with a pattern on a transparent substrate, wherein the transfer mask has an evaluation pattern formed by the thin film, and irradiation durability of the thin film is evaluated by intermittently irradiating pulsed laser light onto the evaluation pattern.

(Structure 15)

A method of manufacturing a semiconductor device, comprising forming a circuit pattern on a semiconductor wafer using the transfer mask manufactured by the method according to Structure 14.

Hereinbelow, this invention will be described in detail.

The thin film evaluation method of this invention is a thin film evaluation method for a transfer mask adapted to be applied with ArF excimer laser exposure light and comprising a thin film formed with a pattern on a transparent substrate, wherein the method comprises intermittently irradiating pulsed laser light onto the thin film to thereby evaluate irradiation durability of the thin film (Structure 1).

By intermittently irradiating the pulsed laser light onto the thin film as described above, it is possible to carry out an irradiation durability evaluation of the thin film which has a higher correlation with the result of an irradiation durability evaluation by actual scanner exposure.

On the other hand, if the pulsed laser light is continuously irradiated onto the thin film, there occurs a phenomenon which is different from actual scanner exposure, and therefore, there occurs a state which cannot be said to evaluate the intended irradiation durability. For example, in the case of carrying out a simple evaluation of the irradiation durability by continuously irradiating the pulsed laser light onto the thin film, the change (increase) in the line width may be accelerated so that it is possible to underestimate (judge defective) the irradiation durability of the thin film which should be evaluated good with a small change (increase) in the line width according to the result of an irradiation durability evaluation by actual scanner exposure.

In this invention, "intermittently irradiating" or "intermittent irradiation" represents repeating irradiation and non-irradiation with respect to a fixed position on a mask. For example, "intermittent irradiation" represents carrying out irradiation for a predetermined time S, then stopping or ceasing the irradiation for a predetermined time T, and repeating this cycle with respect to a fixed position (fixed portion) on a mask.

A method of intermittent irradiation may be a method in which the pulsed laser light is emitted by intermittent oscillation and is irradiated onto the thin film at its fixed position (fixed portion) (later-described Structure 4), or a method in which the pulsed laser light is emitted by continuous oscillation and the pulsed laser light and the thin film are moved relative to each other (later-described Structure 6).

In this invention, as a transition metal, use can be made of molybdenum, tantalum, tungsten, titanium, chromium, hafnium, nickel, vanadium, zirconium, ruthenium, rhodium, or the like.

In this invention, the thin film may be made of a material containing, in addition to the transition metal, at least one of nitrogen, oxygen, carbon, hydrogen, inert gases (helium, argon, xenon, etc.), and so on.

In this invention, the thin film can be a light-shielding film in a binary mask or a light-semitransmissive film in a phase shift mask.

In this invention, the thin film may be made of a material containing the transition metal and silicon (Structure 2).

This is because, as described above, when the thin film is made of the material containing the transition metal and silicon, the phenomenon remarkably occurs in which the line width changes (increases) due to the irradiation of ArF excimer laser light (wavelength: 193 nm).

In this invention, the thin film may be made of a material containing, in addition to the transition metal and silicon, at least one of nitrogen, oxygen, carbon, hydrogen, inert gases (helium, argon, xenon, etc.), and so on.

In this invention, the thin film can be a light-shielding film in a binary mask or a light-semitransmissive film in a phase shift mask.

In this invention, it is preferable that the pulsed laser light be intermittently irradiated to a degree that does not cause heating of the thin film (Structure 3).

The present inventor has found that if the thin film is heated, the evaluation of the irradiation durability largely changes. For example, in the case of carrying out a simple evaluation of the irradiation durability by continuously irradiating the pulsed laser light onto the thin film, the change (increase) in the line width may be suppressed so that it is possible to overestimate (judge good) the irradiation durability of the thin film which should be evaluated defective with a large change (increase) in the line width according to the result of an irradiation durability evaluation by actual scanner exposure. The reason for this is considered to be that when the pulsed laser light is continuously irradiated so that the thin film is heated (generates heat), there occurs a state where water is not present locally at a heated portion of the thin film. In order for a change in the line width (e.g. a phenomenon in which Si becomes $SiO_2$ to increase in volume) to occur, the oxidation is considered to proceed in the presence of water and oxygen and thus the presence of water and oxygen is considered necessary.

In the scanner exposure, since exposure light is not continuously irradiated onto the mask at its fixed position (fixed portion), the thin film is hardly heated. In this invention, "a degree that does not cause heating of the thin film" is preferably the same degree that the thin film is hardly heated in the scanner exposure. Further, "a degree that does not cause heating of the thin film" is preferably such that the rise in the average temperature of the entire thin-film-coated substrate is 2° C. or less.

In this invention, it is preferable that the pulsed laser light be emitted by intermittent oscillation and irradiated onto the thin film at its fixed position (Structure 4).

Herein, "intermittent oscillation" represents carrying out pulse oscillation of a predetermined number N of pulses (shots), then stopping or ceasing the pulse oscillation for a predetermined time T, and repeating this cycle. On the other hand, "continuous oscillation" represents continuously carrying out pulse oscillation with no cessation period (a continuous oscillation mode).

In this invention, a cessation period of the intermittent oscillation is preferably 100 msec to 3000 msec (Structure 5).

In this invention, the cessation period may be set to a time long enough to prevent heating of the thin film. Although it depends on the energy density of the laser light, if the cessation period is 100 msec or more, the heat is fully dissipated and thus is hardly stored. If the cessation period is longer, there is no problem of heat storage.

Although it depends on the energy density of the laser light, if the cessation period is set to 100 msec to 3000 msec or further to 500 msec to 1000 msec, it is considered possible to carry out an evaluation having a high correlation with the result of the scanner exposure.

In this invention, the oscillation frequency of the pulsed laser light is preferably 300 Hz or more and more preferably 500 Hz or more. On the other hand, the oscillation frequency of the pulsed laser light is preferably 2000 Hz or less and more preferably 1000 Hz or less. If it is higher than 2000 Hz, the condition approaches that of the scanner exposure, but the cost becomes high.

The oscillation frequency of pulsed laser light in the scanner is 4000 Hz to 6000 Hz. It is considered possible to carry out an evaluation having a high correlation with the result of the scanner exposure if the oscillation frequency of the pulsed laser light in the evaluation is set close to that in the scanner.

In this invention, it is preferable that the energy density of the laser light be adjusted low and the cycle of the intermittent irradiation for the fixed position (fixed portion) on the mask be adjusted so that the thin film is not heated (does not generate heat).

The energy density per pulse is preferably, for example, about 2.5 to 15 $mJ/cm^2$/pulse. This is because, since the oscillation frequency of the pulsed laser light is lower than that in the scanner exposure, the energy density higher than that in the scanner exposure is required in order to obtain the same heat energy, but if the energy density is increased, the thin film is heated.

The present inventor has found that there are conditions of an acceleration test that can relatively improve the correlation with the result of the scanner exposure.

In this invention, it is preferable to control the respective conditions, i.e. the energy density, the oscillation frequency (number of shots), the pulse width, and the cessation period, (particularly, to control the balance of the respective conditions) so that there occur changes (increase in line width, etc.) equivalent to, approximate to, or similar to changes (increase in line width, etc.) which occur in the mask (reticle) by the scanner exposure.

For example, if both the energy density and the oscillation frequency are extremely low, the energy is too low to cause any change in the thin film so that an irradiation durability test cannot be effected. Therefore, it is necessary to provide a certain amount of energy necessary for reaction.

For example, it is considered that although the reaction of change (increase) in the line width is promoted as the energy increases, if the thin film is heated to reduce water as a factor for change (increase) in the line width, the reaction of change (increase) in the line width is suppressed. In this way, it is considered that the promotion of reaction due to the increase in energy and the suppression of reaction due to the reduction in water are inversely proportional to (cross to) each other. Therefore, it is considered important to balance them.

In this invention, the pulsed laser light is emitted by continuous oscillation and can be intermittently irradiated onto the thin film by relatively moving the thin film with respect to the pulsed laser light (Structure 6).

Herein, "continuous oscillation" represents carrying out oscillation in the continuous oscillation mode and represents continuously carrying out oscillation for a certain time (e.g. 1 minute or more) with no cessation period. In order to prevent damage to a laser irradiation apparatus, it is necessary to cease the oscillation after continuously carrying out the oscillation for the certain time.

In the case of the Structure 6, one or both of the substrate and the laser light may be moved.

In the case of the Structure 6, the structure of the apparatus becomes complicated and, since a portion where the irradiation durability evaluation is not required is also irradiated with the pulsed laser light, it is rather wasteful, while, the conditions can be closer to the conditions of actual scanner exposure. In terms of more reproducing the conditions of the scanner exposure, it is preferable to relatively move the thin film, but in terms of carrying out an evaluation more easily and in a shorter time, the Structure 4 is considered more suitable. It is preferable to select the method according to the situation.

In this invention, the pulsed laser light is preferably irradiated onto the thin film in a humidity-controlled atmosphere (Structure 7).

As a condition of use in the scanner exposure, there is an environment where the humidity is controlled at 35 to 50% RH (Relative Humidity) like in a clean room, or an environment which is controlled at a low humidity of 10 to 0% RH as a measure to counter haze. It is preferable to carry out an evaluation according to such a condition of use in the scanner exposure.

In this invention, the pulsed laser light is preferably irradiated onto the thin film in an environment where an amount of a chemical contaminant in an atmosphere is controlled (Structure 8).

This is for reducing the occurrence of haze. This is because it has been found that when the irradiation conditions of the pulsed laser light are changed, haze occurs or does not occur depending on irradiation conditions.

In this invention, the thin film may be a light-semitransmissive film made of a material composed mainly of a compound containing the transition metal, silicon, and one or more elements selected from oxygen and nitrogen (Structure 9).

This is because, as described above, when the thin film is the light-semitransmissive film (e.g. phase shift film) made of the material containing the transition metal and silicon, the phenomenon remarkably occurs in which the transmittance and the phase difference change and further the line width changes (increases) due to the irradiation of ArF excimer laser light (wavelength: 193 nm).

Herein, as the transition metal, use can be made of molybdenum, tantalum, tungsten, titanium, chromium, hafnium, nickel, vanadium, zirconium, ruthenium, rhodium, or the like.

In this invention, the light-semitransmissive film may be made of a material containing, in addition to the transition metal, at least one of nitrogen, oxygen, carbon, hydrogen, inert gases (helium, argon, xenon, etc.), and so on.

The light-semitransmissive film may comprise, for example, a transition metal silicide, a transition metal silicide nitride, a transition metal silicide oxynitride, or a transition metal silicide oxide.

In this invention, the light-semitransmissive film may have a single-layer structure, a two-layer structure comprising a low-transmittance layer and a high-transmittance layer, or a multilayer structure.

The light-semitransmissive film may be of the high-transmittance type. The high-transmittance type has a relatively high transmittance of 10% to 30% while the transmittance is normally 1% to less than 10%.

In this invention, the thin film may be a light-shielding film (Structure 10).

This is because the problem of irradiation durability also applies to the light-shielding film.

The light-shielding film may have a single-layer structure or a plural-layer structure or may be a composition gradient film.

The light-shielding film may comprise an antireflection layer.

The light-shielding film may have a three-layer structure comprising a back-surface antireflection layer, a light-shielding layer, and a front-surface antireflection layer.

The light-shielding film may have a two-layer structure comprising a light-shielding layer and a front-surface antireflection layer.

In this invention, the light-shielding film may be made of a material containing, in addition to the transition metal and silicon, at least one of nitrogen, oxygen, carbon, hydrogen, inert gases (helium, argon, xenon, etc.), and so on. The light-shielding film may comprise, for example, a transition metal silicide, a transition metal silicide nitride, a transition metal silicide oxynitride, or a transition metal silicide oxide.

In this invention, the light-shielding film may be made of a material containing, in addition to the transition metal, at least one of nitrogen, oxygen, carbon, hydrogen, inert gases (helium, argon, xenon, etc.), and so on.

In this invention, when the light-shielding film is made of molybdenum silicide compounds, the light-shielding film may have, for example, a two-layer structure comprising a light-shielding layer (MoSi or the like) and a front-surface antireflection layer (MoSiON or the like) or a three-layer structure further comprising a back-surface antireflection layer (MoSiON, MoSiN, or the like) between the light-shielding layer and the substrate.

In a mask blank of this invention, the irradiation durability of a thin film is evaluated and guaranteed by the thin film evaluation method according to any one of the Structures 1 to 10 (Structure 11).

The guarantee of a mask blank can be achieved by producing a thin-film-coated substrate for evaluation, evaluating the irradiation durability of a thin film, obtaining conditions (composition, film forming conditions, etc.) satisfying the irradiation durability evaluation criterion, and producing a mask blank using the obtained conditions.

Alternatively, the guarantee of a mask blank can be achieved by evaluating a thin film by the above-mentioned evaluation method each time the thin film is formed on a transparent substrate.

The evaluation result may be attached to a case receiving therein the mask blank and provided to a mask manufacturing department (mask maker). In this case, the evaluation result is recorded on a paper medium or a storage medium (flexible disk, CD, etc.) and attached to the mask blank case.

According to such a mask blank of which the irradiation durability is guaranteed, even when a transfer mask is manufactured by patterning the thin film and then is subjected to actual scanner exposure and the cumulative exposure amount reaches 10 kJ/cm$^2$, there is obtained an effect that the CD change can be 5 nm or less and further 3 nm or less.

By intermittently irradiating the pulsed laser light onto a fixed portion, it is possible to carry out an evaluation having a higher correlation with the result of an irradiation durability evaluation by actual scanner exposure and thus it is possible to carry out a high-accuracy irradiation durability evaluation with only a small difference from the result of the irradiation durability evaluation by actual scanner exposure as compared with the case where the pulsed laser light is continuously irradiated onto the fixed portion.

In contrast, in the case of a mask blank of which the irradiation durability is evaluated by continuously irradiating the pulsed laser light onto a thin film, it is not possible to guarantee that the difference from the result of the irradiation durability evaluation by actual scanner exposure is small. As a consequence, for example, there is an inconvenience that it is possible, in a simple evaluation, to overestimate (judge good) the irradiation durability of the thin film which should be evaluated defective with a large change (increase) in the line width according to the result of an irradiation durability evaluation by actual scanner exposure. On the other hand, for example, there is an inconvenience that it is possible, in a simple evaluation, to underestimate (judge defective) the irradiation durability of the thin film which should be evaluated good with a small change (increase) in the line width according to the result of an irradiation durability evaluation by actual scanner exposure. According to the mask blank of this invention, there is no such an inconvenience.

A transfer mask of this invention is manufactured by using the mask blank according to the Structure 11 and patterning the thin film (Structure 12).

By manufacturing such a transfer mask using the mask blank of which the irradiation durability is guaranteed, even when actual scanner exposure is carried out and the cumulative exposure amount reaches 10 kJ/cm$^2$, there is obtained an effect that the CD change can be 5 nm or less and further 3 nm or less.

A transfer mask manufacturing method of this invention is a method of manufacturing a transfer mask adapted to be applied with ArF excimer laser exposure light and comprising a thin film formed with a pattern on a transparent substrate, wherein the transfer mask comprises an evaluation pattern formed by the thin film, and the irradiation durability of the thin film is evaluated by intermittently irradiating pulsed laser light onto the evaluation pattern (Structure 14).

The evaluation pattern formed by the thin film can be provided in an area outside of a transfer pattern forming area (e.g. 132 mm×132 mm) of the transfer mask.

By evaluating the irradiation durability of a thin film each time such a transfer mask is manufactured as described above, the irradiation durability of the transfer masks can be guaranteed individually. For example, even if transfer masks are manufactured using mask blanks of the same specification, the irradiation durability may differ depending on a difference in the transfer mask manufacturing processes, but with the above-mentioned structure, the irradiation durability of the transfer masks can be guaranteed with higher accuracy.

The evaluation result may be attached to a case receiving therein the transfer mask and provided to a semiconductor manufacturing department (device maker). In this case, the evaluation result is recorded on a paper medium or a storage medium (flexible disk, CD, etc.) and attached to the transfer mask case.

A semiconductor device manufacturing method of this invention comprises forming a circuit pattern on a semiconductor wafer using the transfer mask according to the Structure 12 or using the transfer mask manufactured by the transfer mask manufacturing method according to the Structure 14 (Structure 13 or 15).

Using the transfer mask of this invention, a transfer pattern is exposed and transferred onto a resist film on a semiconductor wafer as a transfer target. Use can be made of an exposure apparatus of the immersion type with annular illumination which uses an ArF excimer laser as a light source. Specifically, by setting the transfer mask on a mask stage of the exposure apparatus, a transfer pattern is exposed and transferred onto a resist film for ArF immersion exposure formed on a semiconductor wafer. Then, the exposed resist film is developed, thereby forming a resist pattern. Then, using the resist pattern, a circuit pattern is formed on the semiconductor wafer.

Using the transfer mask of this invention, it is possible to guarantee the manufacture of a semiconductor device of the DRAM half-pitch (hp) 32 nm generation.

This invention includes an invention of an evaluation method which evaluates the thin film irradiation durability by intermittently irradiating pulsed laser light onto a thin film made of a material containing a transition metal and formed on a transparent substrate.

This invention includes an invention of a method which evaluates and guarantees the thin film irradiation durability based on the fact that the thin film CD change is 5 nm or less when pulsed laser light is intermittently irradiated onto a thin film pattern made of a material containing a transition metal and formed on a transparent substrate.

In this invention, ArF excimer laser light is preferable as the pulsed laser light. This is because the above-mentioned phenomenon of the line width change (increase) is remarkably observed in the case of short-wavelength exposure light such as ArF excimer laser light. This is considered to be also related with the generation of ozone around the wavelength (193 nm) of ArF excimer laser light or the like.

In this invention, the resist is preferably a chemically amplified resist. This is because the chemically amplified resist is suitable for high-accuracy processing.

In this invention, the resist is preferably a resist for electron beam writing. This is because the resist for electron beam writing is suitable for high-accuracy processing.

This invention is applicable to an electron-beam-writing mask blank adapted to be formed with a resist pattern by electron beam writing.

In this invention, the transparent substrate is not particularly limited as long as it has transparency at an exposure wavelength to be used. In this invention, a quartz substrate and various other glass substrates (e.g. CaF$_2$ substrate, soda-lime glass substrate, alkali-free glass substrate, aluminosilicate glass substrate, etc.) can be used. Among them, the quartz substrate is particularly suitable for this invention because it has high transparency in the wavelength range of ArF excimer laser light.

In this invention, the transfer mask may be a binary mask that does not use the phase shift effect, or a phase shift mask. The transfer mask may be a reticle.

The phase shift mask may be a phase shift mask of the halftone type (tri-tone type), the Levenson type, the auxiliary pattern type, the self-aligned type (edge-enhanced type), or the like or an enhancer mask.

In this invention, in addition to the light-semitransmissive film or the light-shielding film and its pattern, another thin film and its pattern can be formed.

For example, in the case where the material of the light-semitransmissive film or the light-shielding film is a transition metal silicide, a material of the other thin film can be composed of a material having etching selectivity (etching resistance) to the light-semitransmissive film or the light-shielding film, such as chromium, a chromium compound in which an element such as oxygen, nitrogen, or carbon is added to chromium, another transition metal, another transition metal silicide, or the like.

On the other hand, for example, in the case where the material of the light-semitransmissive film or the light-shielding film is a transition metal (e.g. a material containing chromium), a material of the other thin film can be composed of a material having etching selectivity (etching resistance) to the light-semitransmissive film or the light-shielding film, such as a silicide of the transition metal, another transition metal, another transition metal silicide, or the like.

The other thin film may be a light-shielding film which is formed on the upper or lower side of the light-semitransmissive film (e.g. phase shift film), an etching mask film, an etching stopper film, or the like. As the other thin film, use is made of, for example, a material containing chromium.

In this invention, as the material containing chromium, use can be made of chromium (Cr) alone or a material containing chromium (Cr) and one or more elements selected from nitrogen (N), oxygen (O), carbon (C), hydrogen (H), helium (He), and so on. For example, use can be made of Cr, CrN, CrO, CrNO, CrNC, CrCON, or the like or a material containing, in addition thereto, hydrogen (H) or helium (He).

In this invention, use can be made of, for example, a fluorine-based gas such as $SF_6$, $CF_4$, $C_2F_6$, or $CHF_3$ or a mixed gas of such a fluorine-based gas and He, $H_2$, $N_2$, Ar, $C_2H_4$, $O_2$, or the like for dry-etching the thin film containing the transition metal and silicon.

In this invention, use can be made of a dry etching gas in the form of a mixed gas containing a chlorine-based gas and an oxygen gas for dry-etching the chromium-based thin film.

In this invention, as the chlorine-based gas for use in the dry etching, use can be made of, for example, $Cl_2$, $SiCl_4$, HCl, $CCl_4$, $CHCl_3$, or the like.

According to this invention, by intermittently irradiating pulsed laser light onto a fixed portion, it is possible to carry out a high-accuracy irradiation durability evaluation with only a small difference from the result of an irradiation durability evaluation by actual scanner exposure as compared with the case where the pulsed laser light is continuously irradiated onto the fixed portion. As a consequence, an efficient and high-accuracy irradiation durability evaluation is enabled.

DESCRIPTION OF THE EXEMPLARY EMBODIMENTS

EXAMPLES

Hereinbelow, this invention will be described in more detail with reference to Examples.

Example 1 and Comparative Example 1

(Manufacture of Mask Blank)

Figure 1:
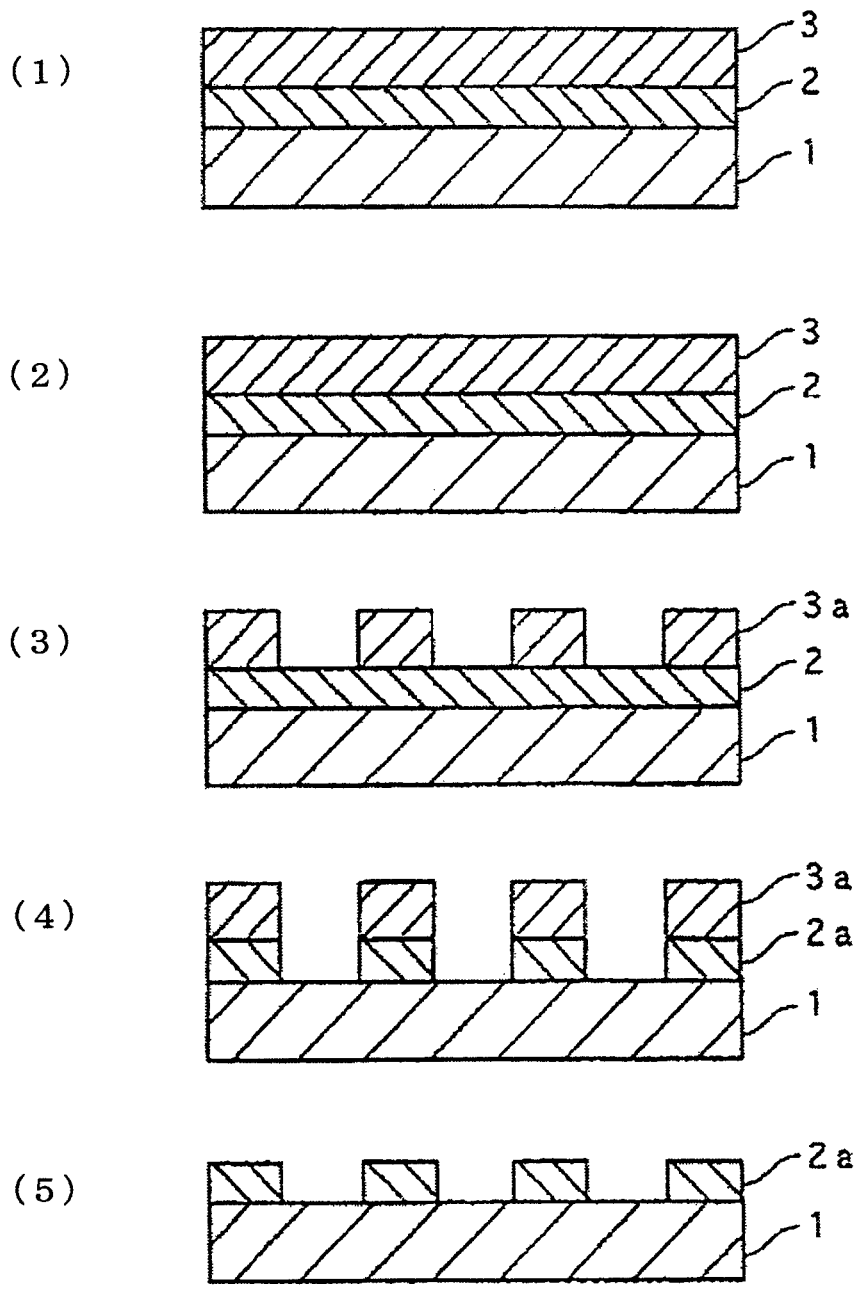
FIG. 1, (1) to (5) are exemplary cross-sectional views showing the processes of manufacturing a phase shift mask.

As shown in FIG. 1, (1), using a synthetic quartz glass substrate having a 6-inch square size with a thickness of 0.25 inches as a transparent substrate 1, a light-semitransmissive film 2 made of molybdenum, silicon, and nitrogen was formed on the transparent substrate 1.

Specifically, using a mixed target of molybdenum (Mo) and silicon (Si) (Mo:Si=10 at %:90 at %), reactive sputtering (DC sputtering) was carried out by setting the power of a DC power supply to 3.0 kW in a mixed gas atmosphere of argon (Ar), nitrogen ($N_2$), and helium (He) (gas flow rates Ar:8 sccm, $N_2$:72 sccm, He:100 sccm) at a gas pressure of 0.3 Pa, thereby forming a MoSiN film made of molybdenum, silicon, and nitrogen to a thickness of 69 nm on the transparent substrate. Then, a heat treatment was applied to the substrate formed with the MoSiN film. Specifically, using a heating furnace, the heat treatment was carried out in the atmosphere at a heating temperature of 450° C. for a heating time of 1 hour.

This MoSiN film had a transmittance of 6.1% with a phase difference of 178.2 degrees at a wavelength (193 nm) of ArF excimer laser light.

This MoSiN film was analyzed by XPS (X-ray Photoelectron Spectroscopy). As a result, the composition of the MoSiN film was such that Mo:4.1 at %, Si:35.6 at %, and N:60.3 at %.

In this manner, a phase shift mask blank was manufactured.

(Manufacture of Transfer Mask)

Then, on the mask blank thus obtained, a chemically amplified positive resist for electron beam writing (PRL009: manufactured by FUJIFILM Electronic Materials Co., Ltd.) was coated to form a resist film 3 (see FIG. 1, (1)). The resist film 3 was formed by spin coating using a spinner (spin coating apparatus).

Then, using an electron beam writing apparatus, a required pattern was written on the resist film 3 and, thereafter, the resist film 3 was developed with a predetermined developer, thereby forming a resist pattern 3a (see FIG. 1, (2) and (3)).

Then, using the resist pattern 3a as a mask, the light-semitransmissive film (MoSiN film) 2 was dry-etched, thereby forming a light-semitransmissive film pattern 2a (see FIG. 1, (4)). A mixed gas of $SF_6$ and He was used as a dry etching gas.

Then, the remaining resist pattern was stripped, thereby obtaining a phase shift mask (see FIG. 1, (5)).

There was almost no change in the composition, transmittance, and phase difference of the light-semitransmissive film as compared with those at the time of the manufacture of the mask blank.

(Evaluation)

The durability against ArF excimer laser light irradiation was examined for the light-semitransmissive film (MoSiN film) pattern of the phase shift mask thus obtained.

In Example 1, the conditions of the ArF excimer laser light irradiation were as follows. Specifically, using an ArF excimer laser oscillation (irradiation) apparatus (see FIG. 3), the intermittent irradiation was carried out in an environment (atmosphere) of relative humidity 35% RH for 15 hours under the conditions such that the oscillation frequency was set to 500 Hz, the energy density per pulse was set to 10 $mJ/cm^2$/pulse, the number of pulses to be continuously emitted was set to 10, the time for this event (time required for continuously emitting 10 pulses) was set to 20 ms, the pulse width was set to 5 ns, and the cessation period (interval period) after the continuous pulse emission (continuous oscillation) was set to 500 ms (see FIG. 4). The cumulative exposure amount was set to 10 $kJ/cm^2$.

Figure 3:
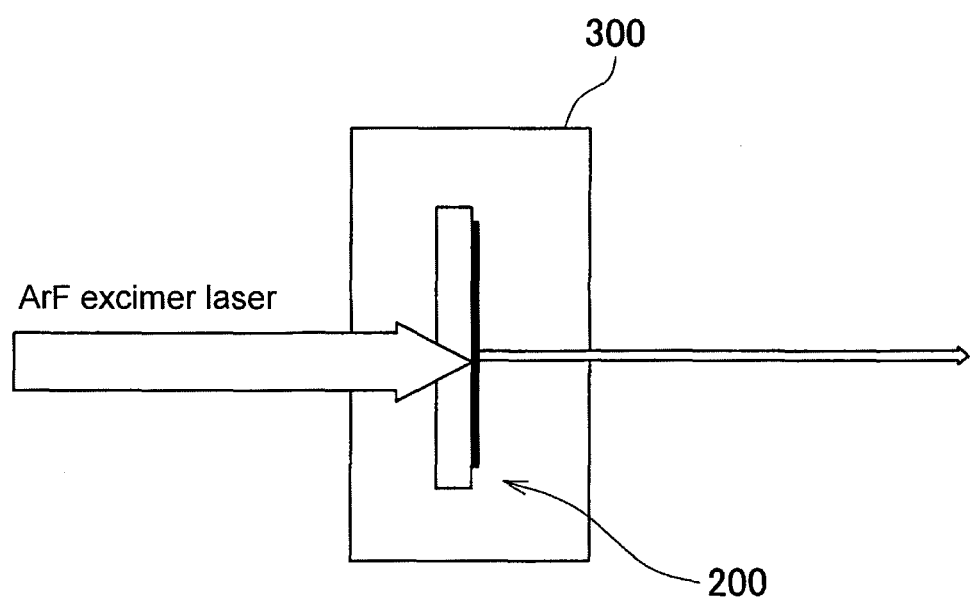
FIG. 3 is a diagram showing the outline of an irradiation durability evaluation apparatus (ArF excimer laser irradiation apparatus)
Figure 4:
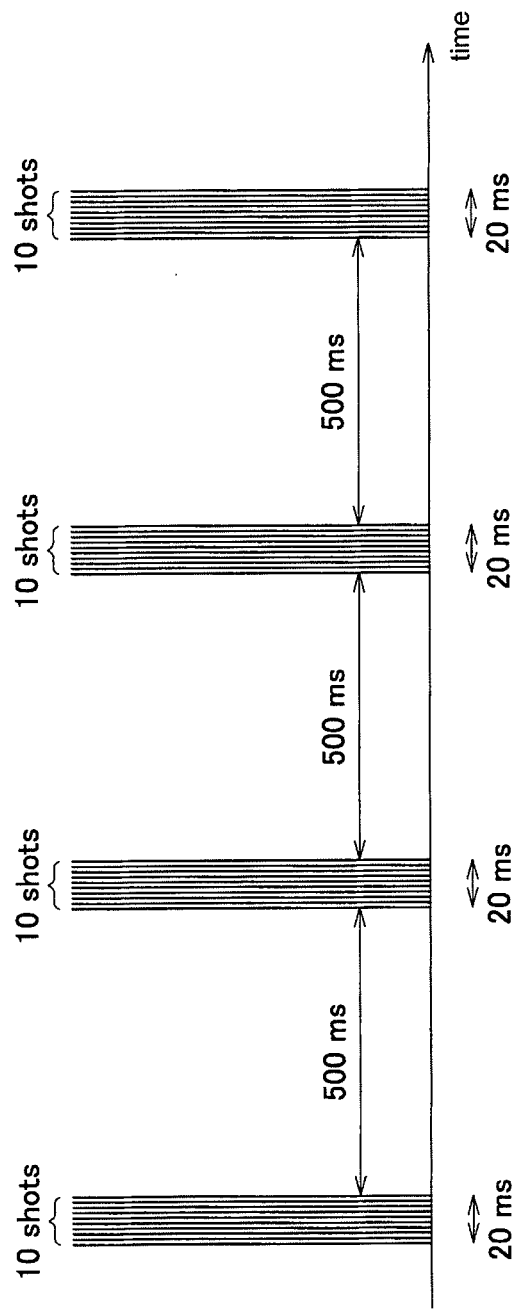
FIG. 4 is an exemplary diagram for explaining the intermittent irradiation.

As shown in FIG. 3, ArF excimer laser light is irradiated from the transparent substrate side of a transfer mask (phase shift mask) 200. In this event, the transfer mask is disposed in a chamber 300 which is controlled in the above-mentioned atmosphere.

In Comparative Example 1, the conditions of the ArF excimer laser light irradiation were as follows. Specifically, using an ArF excimer laser oscillation (irradiation) apparatus (see FIG. 3), the irradiation was carried out in an environment (atmosphere) of relative humidity 35% RH for 1 hour under the conditions of a continuous oscillation mode such that the oscillation frequency was set to 200 Hz, the energy density per pulse was set to 20 mJ/cm$^2$/pulse, and the pulse width was set to 5 ns. The cumulative exposure amount was set to 10 kJ/cm$^2$.

Before and after the ArF excimer laser light irradiation under the conditions of Example 1, the CD change in a 200 nm line-and-space pattern was 6 nm. The difference between this value and a CD change when the exposure equivalent to the cumulative exposure amount of 10 kJ/cm$^2$ was carried out by a scanner was 1 nm or less. Thus, the correlation between them was good.

Before and after the ArF excimer laser light irradiation under the conditions of Comparative Example 1, the CD change in a 200 nm line-and-space pattern was 15 nm. The difference between this value and the CD change when the exposure equivalent to the cumulative exposure amount of 10 kJ/cm$^2$ was carried out by the scanner was about 10 nm. Thus, the correlation between them was not good.

Example 2 and Comparative Example 2

(Manufacture of Mask Blank)

Figure 2:
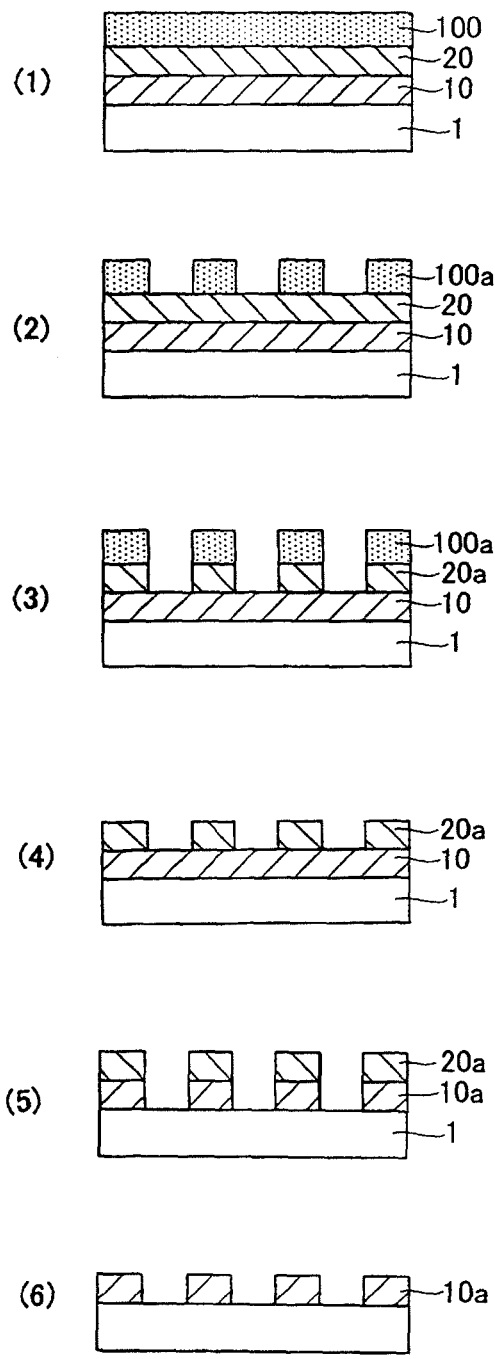
FIG. 2, (1) to (6) are exemplary cross-sectional views showing the processes of manufacturing a binary mask.

As shown in FIG. 2, using a synthetic quartz glass substrate having a 6-inch square size with a thickness of 0.25 inches as a transparent substrate 1, a MoSiN film (light-shielding layer) and a MoSiON film (front-surface antireflection layer) were respectively formed as a light-shielding film 10 on the transparent substrate 1 (FIG. 2, (1)).

Specifically, using a mixed target of molybdenum (Mo) and silicon (Si) (Mo:Si=21 at %:79 at %), reactive sputtering (DC sputtering) was carried out in a mixed gas atmosphere of argon (Ar) and nitrogen (N$_2$), thereby forming a light-shielding layer (MoSiN film, Mo:Si:N=14.7 at %:56.2 at %:29.1 at %) to a thickness of 50 nm on the transparent substrate 1.

Then, using a mixed target of molybdenum (Mo) and silicon (Si) (Mo:Si=4 at %:96 at %), reactive sputtering (DC sputtering) was carried out in a mixed gas atmosphere of argon (Ar), oxygen (O$_2$), nitrogen (N$_2$), and helium (He), thereby forming a front-surface antireflection layer (MoSiON film, Mo:Si:O:N=2.6 at %:57.1 at %:15.9 at %:24.4 at %) to a thickness of 10 nm on the light-shielding layer.

The elements of the respective layers (light-shielding film) were analyzed by the Rutherford backscattering spectrometry.

The total thickness of the light-shielding film 10 was set to 60 nm. The optical density (OD) of the light-shielding film 10 was 3.0 at a wavelength 193 nm of ArF excimer laser exposure light.

Then, the above-mentioned substrate was heat-treated (annealed) at 450° C. for 1 hour.

Then, an etching mask film 20 that is a chromium-based thin film was formed on the light-shielding film 10 (FIG. 2, (1)).

Specifically, using a DC magnetron sputtering apparatus and using a chromium target, the film formation was carried out in a mixed gas atmosphere of argon (Ar), carbon dioxide (CO$_2$), nitrogen (N$_2$), and helium (He), thereby forming an etching mask film (CrOCN film, Cr:O:C:N=33.0 at %:38.9 at %:11.1 at %:17.0 at %) to a thickness of 15 nm.

The elements of the CrOCN film (etching mask film) were analyzed by the Rutherford backscattering spectrometry.

In this manner, a binary mask blank formed with the light-shielding film for ArF excimer laser light exposure was obtained.

(Manufacture of Transfer Mask)

Then, on the mask blank thus obtained, a chemically amplified positive resist for electron beam writing (exposure) (PRL009: manufactured by FUJIFILM Electronic Materials Co., Ltd.) was coated by a spin-coating method to form a resist film 100 with a thickness of 100 nm (FIG. 2, (1)).

Then, using an electron beam writing apparatus, a required pattern was written on the resist film 100 and, thereafter, the resist film 100 was developed with a predetermined developer, thereby forming a resist pattern 100a (FIG. 2, (2)).

Then, using the resist pattern 100a as a mask, the etching mask film 20 was dry-etched, thereby forming an etching mask film pattern 20a (FIG. 2, (3)). A mixed gas of Cl$_2$ and O$_2$ (Cl$_2$:O$_2$=4:1) was used as a dry etching gas.

Then, the remaining resist pattern 100a was removed (FIG. 2, (4)).

Then, using the etching mask film pattern 20a as a mask, the light-shielding film 10 was dry-etched using a mixed gas of SF$_6$ and He, thereby forming a light-shielding film pattern 10a (FIG. 2, (5)).

Then, the etching mask film pattern 20a was removed by dry etching with a mixed gas of Cl$_2$ and O$_2$ (Cl$_2$:O$_2$=4:1), thereby obtaining a binary mask (FIG. 2, (6)).

(Evaluation)

The durability against ArF excimer laser light irradiation was examined for the light-shielding film pattern 10a of the binary mask thus obtained.

In Example 2, the conditions of the ArF excimer laser light irradiation were as follows. Specifically, using an ArF excimer laser oscillation (irradiation) apparatus (see FIG. 3), the intermittent irradiation was carried out in an environment (atmosphere) of relative humidity 35% RH for 15 hours under the conditions such that the oscillation frequency was set to 500 Hz, the energy density per pulse was set to 10 mJ/cm$^2$/pulse, the number of pulses to be continuously emitted was set to 10, the time for this event (time required for continuously emitting 10 pulses) was set to 20 ms, the pulse width was set to 5 ns, and the cessation period (interval period) after the continuous pulse emission (continuous oscillation) was set to 500 ms (see FIG. 4). The cumulative exposure amount was set to 10 kJ/cm$^2$.

In Comparative Example 2, the conditions of the ArF excimer laser light irradiation were as follows. Specifically, using an ArF excimer laser oscillation (irradiation) apparatus (see FIG. 3), the irradiation was carried out in an environment (atmosphere) of relative humidity 35% RH for 1 hour under the conditions of a continuous oscillation mode such that the oscillation frequency was set to 200 Hz, the energy density per pulse was set to 20 mJ/cm$^2$/pulse, and the pulse width was set to 5 ns. The cumulative exposure amount was set to 10 kJ/cm$^2$.

Before and after the ArF excimer laser light irradiation under the conditions of Example 2, the CD change in a 200 nm line-and-space pattern was 3 nm. The difference between this value and a CD change when the exposure equivalent to the cumulative exposure amount of 10 kJ/cm$^2$ was carried out by a scanner was 1 nm or less. Thus, the correlation between them was good.

Before and after the ArF excimer laser light irradiation under the conditions of Comparative Example 2, the CD change in a 200 nm line-and-space pattern was 5.5 nm. The difference between this value and the CD change when the exposure equivalent to the cumulative exposure amount of 10 kJ/cm$^2$ was carried out by the scanner was about 3 nm. Thus, the correlation between them was not good.

While this invention has been described with reference to the Examples, this invention is not limited thereto. Various changes that can be understood by a person skilled in the art can be made to the structures and details of this invention within the spirit and scope of this invention described in claims.

What is claimed is:

1. A thin film evaluation method for a transfer mask adapted to be applied with ArF excimer laser exposure light and comprising a thin film formed with a pattern on a transparent substrate, the method comprising:

intermittently irradiating pulsed laser light onto the thin film to thereby evaluate irradiation durability of the thin film.

2. The thin film evaluation method according to claim 1, wherein the thin film is made of a material containing a transition metal and silicon.

3. The thin film evaluation method according to claim 1, wherein the pulsed laser light is intermittently irradiated to a degree that does not cause heating of the thin film.

4. The thin film evaluation method according to claim 1, wherein the pulsed laser light is emitted by intermittent oscillation and is irradiated onto the thin film at its fixed position.

5. The thin film evaluation method according to claim 4, wherein a cessation period of the intermittent oscillation is 100 msec to 3000 msec.

6. The thin film evaluation method according to claim 1, wherein the pulsed laser light is emitted by continuous oscillation and is intermittently irradiated onto the thin film by relatively moving the thin film with respect to the pulsed laser light.

7. The thin film evaluation method according to claim 1, wherein the pulsed laser light is irradiated onto the thin film in a humidity-controlled atmosphere.

8. The thin film evaluation method according to claim 1, wherein the pulsed laser light is irradiated onto the thin film in an environment where an amount of a chemical contaminant in an atmosphere is controlled.

9. The thin film evaluation method according to claim 1, wherein the thin film is a light-semitransmissive film made of a material composed mainly of a compound containing a transition metal, silicon, and one or more elements selected from oxygen and nitrogen.

10. The thin film evaluation method according to claim 1, wherein the thin film is a light-shielding film.

* * * * *